US010453676B2

(12) United States Patent
Nakayama

(10) Patent No.: US 10,453,676 B2
(45) Date of Patent: Oct. 22, 2019

(54) SEMICONDUCTOR DEVICE MANUFACTURING METHOD AND RECORDING MEDIUM

(71) Applicant: HITACHI KOKUSAI ELECTRIC INC., Tokyo (JP)

(72) Inventor: Masanori Nakayama, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 0 days.

(21) Appl. No.: 15/630,472

(22) Filed: Jun. 22, 2017

(65) Prior Publication Data

US 2017/0287707 A1    Oct. 5, 2017

Related U.S. Application Data

(63) Continuation of application No. PCT/JP2015/085247, filed on Dec. 16, 2015.

(30) Foreign Application Priority Data

Dec. 25, 2014 (JP) .................... 2014-262686

(51) Int. Cl.
   *H01L 21/02* (2006.01)
   *H05H 1/46* (2006.01)
   (Continued)

(52) U.S. Cl.
   CPC .... *H01L 21/02252* (2013.01); *H01J 37/3211* (2013.01); *H01J 37/3244* (2013.01);
   (Continued)

(58) Field of Classification Search
   CPC ......... H01L 21/02252; H01L 21/02315; H01L 21/0234; H01L 21/78655; H01L 21/02247;
   (Continued)

(56) References Cited

U.S. PATENT DOCUMENTS

| 5,888,414 A | 3/1999 | Collins et al. |
| 6,238,528 B1* | 5/2001 | Xu .................. C23C 14/358 |
| | | 204/192.12 |

(Continued)

FOREIGN PATENT DOCUMENTS

| JP | 11-162697 A | 6/1999 |
| JP | 2004-186402 A | 7/2004 |

(Continued)

OTHER PUBLICATIONS

International Search Report WO 2016l/04292 A1, dated Mar. 15, 2016.

(Continued)

*Primary Examiner* — Charles D Garber
*Assistant Examiner* — Alia Sabur
(74) *Attorney, Agent, or Firm* — Volpe and Koenig, P.C.

(57) ABSTRACT

A method of manufacturing a semiconductor device includes: preparing a substrate processing apparatus including a substrate process chamber having a plasma-generation space where a nitrogen-containing gas is plasma-exited and a process space where a substrate is mounted in communication with the plasma-generation space, an inductive coupling structure configured by a coil and an impedance matching circuit, wherein electric field combining the coil and the circuit has a length of an integer multiple of a wavelength of an high-frequency power, and a table to mount the substrate under a lower end of the coil; mounting the substrate on the table; supplying the nitrogen-containing gas into the chamber; starting a plasma excitation of the nitrogen-containing gas by applying the high-frequency power to the coil; and nitriding a surface of the substrate with active species containing a nitrogen element at an internal pressure of the chamber ranging from 1 to 100 Pa.

9 Claims, 8 Drawing Sheets

(51) Int. Cl.
  *H01J 37/32* (2006.01)
  *H01L 21/28* (2006.01)
  *H01L 27/11551* (2017.01)
  *H01L 21/321* (2006.01)
  *H01L 27/11524* (2017.01)
  *H01L 27/11556* (2017.01)
  *H01L 27/1157* (2017.01)
  *H01L 27/11582* (2017.01)

(52) U.S. Cl.
  CPC .. *H01J 37/32183* (2013.01); *H01J 37/32724* (2013.01); *H01L 21/02238* (2013.01); *H01L 21/02247* (2013.01); *H01L 21/28273* (2013.01); *H01L 21/32105* (2013.01); *H01L 27/1157* (2013.01); *H01L 27/11524* (2013.01); *H01L 27/11551* (2013.01); *H01L 27/11556* (2013.01); *H01L 27/11582* (2013.01); *H05H 1/46* (2013.01); *H01J 2237/2001* (2013.01); *H01J 2237/202* (2013.01)

(58) Field of Classification Search
  CPC ....... H01J 2237/202; H01J 2237/20235; H01J 37/3211; H05H 2001/4667
  See application file for complete search history.

(56) References Cited

U.S. PATENT DOCUMENTS

| | | | |
|---|---|---|---|
| 2003/0072884 A1* | 4/2003 | Zhang | C23C 16/14 427/255.391 |
| 2005/0202183 A1 | 9/2005 | Matsuda et al. | |
| 2006/0267138 A1* | 11/2006 | Kobayashi | H01L 27/13 257/531 |
| 2007/0298622 A1* | 12/2007 | Terasaki | H01J 37/32678 438/770 |
| 2008/0009126 A1* | 1/2008 | Aslami | C23C 16/24 438/488 |
| 2009/0233430 A1 | 9/2009 | Hirano | |
| 2010/0248435 A1 | 9/2010 | Olsen et al. | |
| 2011/0073931 A1 | 3/2011 | Hirota et al. | |
| 2013/0078789 A1* | 3/2013 | Nakayama | H01L 21/223 438/513 |
| 2013/0267098 A1* | 10/2013 | Maeda | C23C 16/507 438/710 |
| 2014/0106573 A1 | 4/2014 | Terasaki et al. | |
| 2014/0273517 A1 | 9/2014 | Guarini et al. | |
| 2014/0302686 A1* | 10/2014 | Pan | H01L 21/02252 438/778 |

FOREIGN PATENT DOCUMENTS

| | | |
|---|---|---|
| JP | 2009-224755 A | 10/2009 |
| JP | 2009-272547 A | 11/2009 |
| JP | 2011-164743 A | 8/2011 |
| JP | 2011-165743 A | 8/2011 |
| JP | 2012-522399 A | 9/2012 |
| JP | 2014-075579 A | 4/2014 |

OTHER PUBLICATIONS

Korean Office Action dated Jun. 28, 2018 for the Korean Patent Application No. 10-2017-7017370.

* cited by examiner

Pressure dependency of nitride film thickness and uniformity

SEMICONDUCTOR DEVICE MANUFACTURING METHOD AND RECORDING MEDIUM

CROSS-REFERENCE TO RELATED APPLICATION

This application is a Continuation Application of PCT International Application No. PCT/JP2015/085247, filed Dec. 16, 2015, the entire content of which is hereby incorporated by reference.

TECHNICAL FIELD

The present disclosure relates to a technique of modifying a substrate with a plasmized gas using a so-called inductively coupled plasma (ICP) type.

BACKGROUND

Recently, semiconductor devices such as flash memories or the like tend to be highly integrated, and patterns have been remarkably miniaturized according to the high integration trend. When forming these patterns, a process of performing a certain process such as a nitriding or an oxidizing treatment on a substrate is often carried out as one of manufacturing processes.

As one method of forming such patterns, there is a process of forming a groove between circuits and forming a liner film or a wiring on its surface. This groove is configured to have a high aspect ratio according to the recent miniaturization trend.

When a liner film or the like is formed, it is required to form a film having the good step coverage without a variation in film thickness even on an upper side surface, a middle side surface, a lower side surface, and a bottom portion of the groove. By forming the film having the good step coverage, it is possible to make the characteristics of a semiconductor device uniform between the grooves, thereby suppressing a variation in characteristics of the semiconductor device.

In order to process such groove having a high aspect ratio, an attempt has been made to process the groove by using a heated gas or plasmized gas, but it was difficult to form a film having the good step coverage.

SUMMARY

The present disclosure provides some embodiments of a technique capable of forming a nitride film having good step coverage even on a surface of a structure having a high aspect ratio. According to one embodiment of the present disclosure, there is provided a method of manufacturing a semiconductor device, including: preparing a substrate processing apparatus including a substrate process chamber having a plasma generation space where a supplied nitrogen-containing gas is plasma-exited and a substrate process space where a substrate is mounted at the time of processing the substrate in communication with the plasma generation space; an inductive coupling structure which is installed at an outer periphery of the plasma generation space and is configured by a coil and an impedance matching circuit connected to the coil, wherein an electric field combining the coil and the impedance matching circuit has a length of an integer multiple of a wavelength of an applied high-frequency power; and a substrate mounting table configured to mount the substrate at a position under a lower end of the coil; mounting the substrate on the substrate mounting table; supplying the nitrogen-containing gas into the substrate process chamber; starting a plasma excitation of the nitrogen-containing gas in the plasma generation space by applying the high-frequency power to the coil; and nitriding a surface of the substrate with an active species containing a nitrogen element generated by the plasma excitation, wherein in the act of nitriding the surface of the substrate, an internal pressure of the substrate process chamber is set to fall within a range of 1 to 100 Pa.

According to another embodiment of the present disclosure, there is provided a non-transitory computer-readable recording medium storing a program that causes a computer to perform a process, in a substrate processing apparatus including a substrate process chamber having a plasma generation space where a supplied nitrogen-containing gas is plasma-exited and a substrate process space where a substrate is mounted at the time of processing the substrate in communication with the plasma generation space; an inductive coupling structure which is installed at an outer periphery of the plasma generation space and is configured by a coil and an impedance matching circuit connected to the coil, wherein an electric field combining the coil and the impedance matching circuit has a length of an integer multiple of a wavelength of an applied high-frequency power; and a substrate mounting table configured to mount the substrate at a position under a lower end of the coil, the process including; mounting the substrate on the substrate mounting table; supplying the nitrogen-containing gas into the substrate process chamber; starting a plasma excitation of the nitrogen-containing gas in the plasma generation space by applying the high-frequency power to the coil; and nitriding a surface of the substrate with an active species containing a nitrogen element generated by the plasma excitation, wherein in the act of nitriding the surface of the substrate, an internal pressure of the substrate process chamber is set to fall within a range of 1 to 100 Pa.

DETAILED DESCRIPTION

Figure 1:
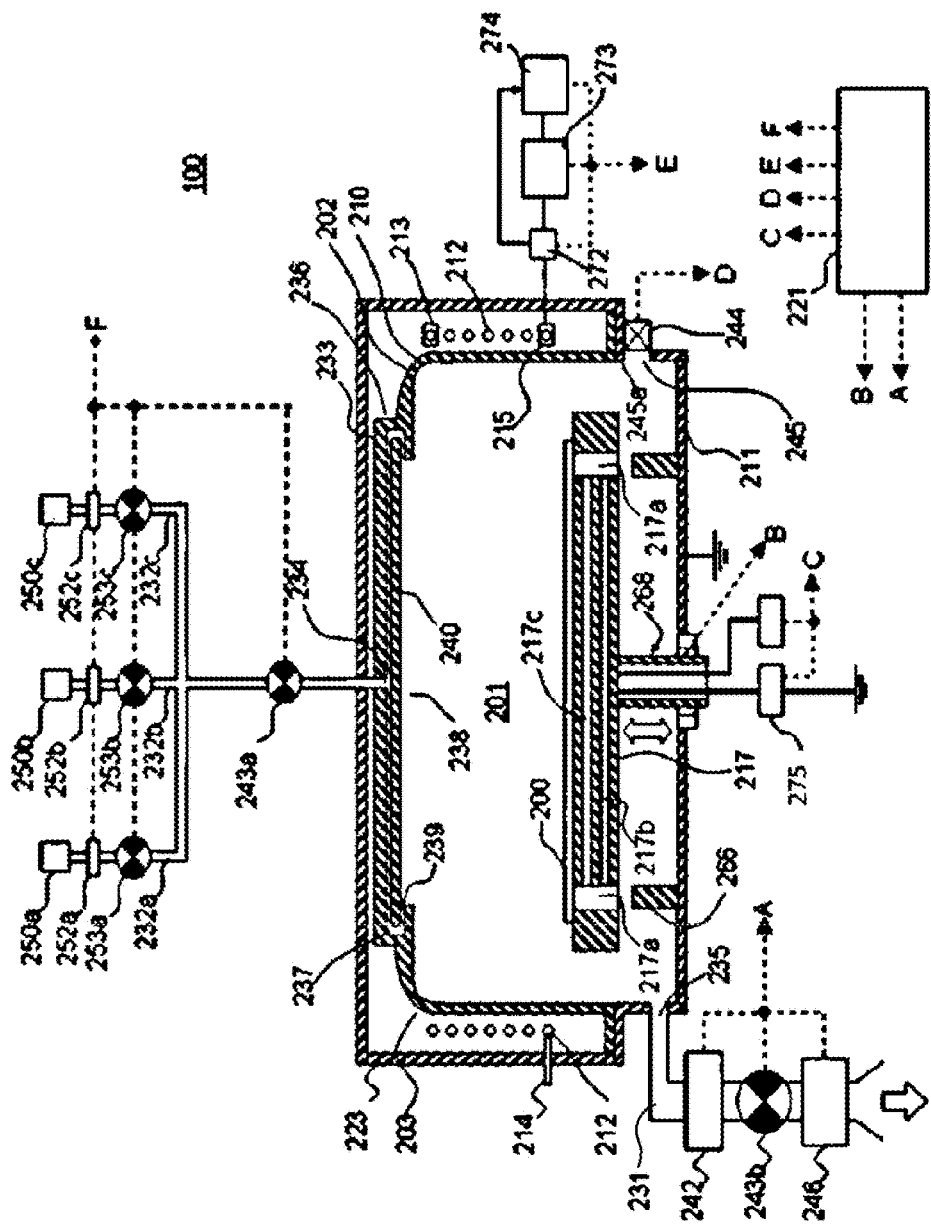
FIG. 1 is a cross sectional view of a substrate processing apparatus according to an embodiment of the present disclosure.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First Embodiment of the Present Disclosure (1) Configuration of the Substrate Processing Apparatus A substrate processing apparatus according to a first embodiment of the present disclosure will now be described with reference FIGS. 1 to 4.
(Process Chamber)

A substrate processing apparatus 100 includes a processing furnace 202 which performs an inductively coupled plasma (ICP) type plasma processing on a wafer 200. A process vessel 203 which defines a process chamber 201 is installed in the processing furnace 202. The process vessel 203 has a dome-shaped upper vessel 210 as a first vessel, and a bowl-shaped lower vessel 211 as a second vessel. The upper vessel 210 is configured to cover the lower vessel 211, forming the process chamber 201. The upper vessel 210 is formed of, for example, a non-metal material such as aluminum oxide ($Al_2O_3$), quartz ($SiO_2$) or the like, and the lower vessel 211 is formed of, for example, aluminum (Al).

Further, a gate valve 244 is installed on a lower sidewall of the lower vessel 211. When the gate valve 244 is opened, the wafer 200 may be loaded into the process chamber 201 via a loading/unloading port 245 using a transfer mechanism (not shown). Alternatively, it is configured such that the wafer 200 may be unloaded from the process chamber 201 via the loading/unloading port 245 using the transfer mechanism (not shown). When the gate valve 244 is closed, it is configured as a partitioning valve that maintains the airtightness of the interior of the process chamber 201.

As will be described hereinbefore, the process chamber 201 has a plasma generation space 201a around which a resonant coil 212 is installed and a substrate process space 201b where the wafer 200 is processed in communication with the plasma generation space 201a. The plasma generation space 201a is a space where the plasma is generated, and refers to a space above a lower end (alternate long and short dash line) of the resonant coil 212 in the process chamber. On the other hand, the substrate process space 201b is a space where a substrate is processed with the plasma, and refers to a space under the lower end of the resonant coil 212.
(Susceptor)

A susceptor 217 (a substrate mounting table) as a substrate mounting part on which the wafer 200 is mounted is disposed at the center of a bottom side of the process chamber 201. The susceptor 217 is formed of, for example, a non-metal material such as aluminum nitride (AlN), ceramics, quartz or the like, and is configured to reduce pollution of a metal such as a film or the like formed on the wafer 200.

A heater 217b as a heating mechanism is integrally embedded in the susceptor 217. The heater 217b is configured to heat a surface of the wafer 200 to a temperature of, for example, about 25 to 700 degrees C., when the electric power is applied thereto.

The susceptor 217 is electrically insulated from the lower vessel 211. An impedance adjustment electrode 217c is installed in the susceptor 217. The impedance adjustment electrode 217c is grounded via an impedance variable mechanism 275 as an impedance adjustment part. The impedance variable mechanism 275 is configured as a coil or a variable condenser and is configured to change impedance within a range of about 0Ω to a parasitic impedance value of the process chamber 201 by controlling the inductance and resistance of the coil and a capacitance value of the variable condenser. Thus, it is possible to control an electric potential (bias voltage) of the wafer 200 through the use of the impedance adjustment electrode 217c and the susceptor 217.

In the susceptor 217, there is installed a susceptor elevating mechanism 268 for moving the susceptor up and down. Through holes 217a are formed in the susceptor 217. Wafer push-up pins 266 are installed on a bottom surface of the lower vessel 211. The through hole 217a and the wafer push-up pin 266 are provided in at least three portions at positions facing each other. When the susceptor 217 is moved down by the susceptor elevating mechanism 268, the wafer push-up pins 266 penetrate the through hole 217a in a state in which the wafer push-up pins 266 do not make contact with the susceptor 217. Further, the position of the susceptor elevating mechanism 268 may be adjusted such that a distance between the wafer 200 mounted on the susceptor 217 and the lower end of the resonant coil 212 is within a range of 40 to 200 mm.

The substrate mounting part according to the present embodiment is mainly configured by the susceptor 217, the heater 217b and the electrode 217c.
(Gas Supply Part)

A gas supply head 236 is installed above the process chamber 201, i.e., in an upper portion of the upper vessel 210. The gas supply head 236 includes a cap-shaped cover 233, a gas introduction port 234, a buffer chamber 237, an opening 238, a shield plate 240, and a gas discharge port 239, and is configured to supply a reaction gas (also referred to as a process gas) into the process chamber 201. The buffer chamber 237 serves as a diffusion space where the reaction gas introduced from the gas introduction port 234 is diffused.

A downstream end of a nitrogen-containing gas supply pipe 232a for supplying a nitrogen ($N_2$) gas as a nitrogen-containing gas, a downstream end of a hydrogen-containing gas supply pipe 232b for supplying a hydrogen ($H_2$) gas as a hydrogen-containing gas, and a downstream end of an inert gas supply pipe 232c for supplying an argon (Ar) gas as an inert gas are connected and joined to the gas introduction port 234. An $N_2$ gas supply source 250a, a mass flow controller (MFC) 252a, which is a flow rate control device, and a valve 253a, which is an opening/closing valve, are installed in the nitrogen-containing gas supply pipe 232a sequentially from the upstream side. An $H_2$ gas supply source 250b, an MFC 252b, which is a flow rate control device, and a valve 253b, which is an opening/closing valve, are installed in the hydrogen-containing gas supply pipe 232b sequentially from the upstream side. An Ar gas supply source 250c, an MFC 252c, which is a flow rate control device, and a valve 253c, which is an opening/closing valve, are installed in the inert gas supply pipe 232c sequentially from the upstream side. A valve 243a is installed at a downstream side of the position where the nitrogen-containing gas supply pipe 232a, the hydrogen-containing gas supply pipe 232b, and the inert gas supply pipe 232c join, and is connected to an upstream end of the gas introduction port 234. By opening and closing the valves 253a, 253b, 253c and 243a, the reaction gases such as the nitrogen-containing gas, the hydrogen-containing gas, the inert gas and the like may be supplied into the process chamber 201 via the gas supply pipes 232a, 232b and 232c, while adjusting the flow rates of the respective gases by the MFCs 252a, 252b and 252c.

Further, when the oxidizing treatment is performed on the substrate, it is configured such that an oxygen ($O_2$) gas as an oxygen-containing gas, instead of the nitrogen-containing gas, is supplied from the gas supply pipe 232a. As the inert gas, in addition to the Ar gas, a rare gas such as a He gas, a Ne gas, or the like may be used.

A gas supply part according to the present embodiment is mainly configured by the gas supply head 236 (the cover 233, the gas introduction port 234, the buffer chamber 237, the opening 238, the shield plate 240 and the gas discharge port 239), the nitrogen-containing gas supply pipe 232a, the hydrogen-containing gas supply pipe 232b, the inert gas supply pipe 232c, the MFCs 252a, 252b and 252c, and the valves 253a, 253b, 253c and 243a.

A nitrogen-containing gas supply system according to the present embodiment is mainly configured by the gas supply head 236 (the cover 233, the gas introduction port 234, the buffer chamber 237, the opening 238, the shield plate 240, and the gas discharge port 239), the nitrogen-containing gas supply pipe 232a, the MFC 252a, and the valves 253a and 243a.

A hydrogen-containing gas supply system according to the present embodiment is mainly configured by the gas supply head 236 (the cover 233, the gas introduction port 234, the buffer chamber 237, the opening 238, the shield plate 240, and the gas discharge port 239), the hydrogen-containing gas supply pipe 232b, the MFC 252b, and the valves 253b and 243a.

Further, an inert gas supply system according to the present embodiment is mainly configured by the gas supply head 236 (the cover 233, the gas introduction port 234, the buffer chamber 237, the opening 238, the shield plate 240, and the gas discharge port 239), the inert gas supply pipe 232c, the MFC 252c, and the valves 253c and 243a.

The gas supply part may include the $N_2$ gas supply source 250a, the $H_2$ gas supply source 250b, and the Ar gas supply source 250c. The nitrogen-containing gas supply system may include the $N_2$ gas supply source 250a. The hydrogen-containing gas supply system may include the $H_2$ gas supply source 250b. The inert gas supply system may include the Ar gas supply source 250c.

(Exhaust Part)

A gas exhaust port 235 configured to exhaust a reaction gas from the interior of the process chamber 201 is installed at a sidewall of the lower vessel 211. An upstream end of a gas exhaust pipe 231 is connected to the gas exhaust port 235. An auto pressure controller (APC) 242 as a pressure regulator (pressure adjustment part), a valve 243b as an opening/closing valve, and a vacuum pump 246 as a vacuum exhaust device are installed in the gas exhaust pipe 231 sequentially from the upstream side.

An exhaust part according to the present embodiment is mainly configured by the gas exhaust port 235, the gas exhaust pipe 231, the APC 242, and the valve 243b. Further, the vacuum pump 246 may be included in the exhaust part.

(Plasma Generation Part)

A spiral resonant coil 212 is installed as a first electrode on an outer peripheral portion of the process chamber 201, i.e., on an outer side of a sidewall of the upper vessel 210, so as to surround the process chamber 201. An RF sensor 272, a high-frequency power source 273, and a frequency matcher 274 are connected to the resonant coil 212.

The high-frequency power source 273 is configured to supply a high-frequency power to the resonant coil 212. The RF sensor 272 is provided on the output side of the high-frequency power source 273. The RF sensor 272 is configured to monitor information of a traveling wave or a reflective wave of the supplied high frequency. The frequency matcher 274 is configured to control the high-frequency power source 273 based on the information of the reflective wave monitored by the RF sensor 272, so as to minimize the reflective wave.

Since the resonant coil 212 forms a standing wave having a predetermined wavelength, a diameter of windings, a pitch of winding times, and the number of turns of the resonant coil 212 are set such that the resonant coil 212 resonates in a constant wavelength mode. That is, the electrical length of the resonant coil 212 is set to a length equivalent to an integer multiple (1 time, 2 times . . . ) of 1 wavelength at a predetermined frequency of electric power supplied from the high-frequency power source 273. For example, in the case of 13.56 MHz, the length of 1 wavelength is about 22 meters. In the case of 27.12 MHz, the length of 1 wavelength is about 11 meters. In the case of 54.24 MHz, the length of 1 wavelength is about 5.5 meters. The resonant coil 212 is supported by a plurality of supports formed in a flat plate shape with an insulating material and vertically installed on an upper end surface of a base plate.

Both ends of the resonant coil 212 are electrically grounded, and at least one end of the resonant coil 212 is grounded via a movable tap 213 as an impedance matching circuit in order to finely adjust the electrical length of the resonant coil 212 at the time of initial installation of the apparatus or at the time of changing the processing conditions. Reference numeral 214 in FIG. 1 denotes the other fixed ground. Further, a power feeding part is configured by the movable tap 215 as an impedance matching circuit between both ends where the resonant coil 212 is grounded in order to finely adjust the impedance of the resonant coil 212 at the time of initial installation of the apparatus or at the time of changing the processing conditions.

That is to say, the resonant coil 212 is provided with electrically grounded ground portions at both ends thereof and is provided a power feeding portion, to which electric power is supplied from the high-frequency power source 273, between respective the ground parts. In addition, at least one of the ground portions is a position-adjustable variable ground portion and the power feeding portion is a position-adjustable variable power feeding portion. When the resonant coil 212 is provided with the variable ground portion and the variable power feeding portion, it is possible to more easily adjust the resonance frequency and load impedance of the process chamber 201 as will be described later. The principle of the plasma generation will be described later.

The RF sensor 272 is installed at the output side of the high-frequency power source 273 to monitor a traveling wave, a reflective wave, or the like. A reflective wave power monitored by the RF sensor 272 is inputted to the frequency matcher 274. The frequency matcher 274 controls the frequency so as to minimize the reflective wave.

A plasma generation part according to the present embodiment is mainly configured by the resonant coil 212, the RF sensor 272, and the frequency matcher 274. Further, the high-frequency power source 273 may be included in the plasma generation part.

Figure 2:
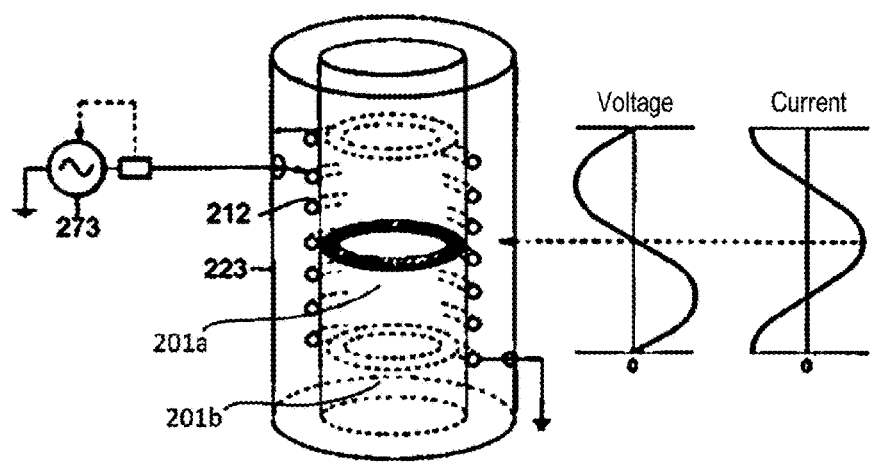
FIG. 2 is an explanatory view illustrating a principle of generating the plasma of the substrate processing apparatus according to an embodiment of the present disclosure.

Here, the principle of generating the plasma of the apparatus according to the present embodiment and the properties of the generated plasma will be described with reference to FIG. 2.

Since the resonant coil 212 forms a standing wave having a predetermined wavelength, a diameter of windings, a pitch of winding times, and the number of turns of the resonant coil 212 are set such that the resonant coil 212 resonates in a full wavelength mode. That is, the electrical length of the resonant coil 212 is set to an integer multiple (1 times, 2 times . . . ) of 1 wavelength in a predetermined frequency of electric power applied from the high-frequency power source 273.

Specifically, in view of the electric power to be applied, the intensity of the magnetic field to be generated, the external form of the apparatus to be applied, or the like, the resonant coil 212 is configured to have an effective cross-sectional area of 50 to 300 mm$^2$ and a coil diameter of 200 to 500 mm and wound around an outer periphery of a chamber which defines a plasma generation space 201a by 2 to 60 times such that a magnetic field of 0.01 to 10 Gauss can be generated by a high-frequency power of, for example, 800 kHz to 50 MHz and 0.5 KW to 5 KW. As a material of which the resonant coil 212 is made, it may be possible to use a copper pipe, a thin plate of copper, an aluminum pipe, an aluminum thin plate, a material obtained by vapor-depositing copper or aluminum on a polymer belt, or the like.

One end or both ends of the resonant coil 212 are generally grounded via a movable tap in order to finely adjust the electrical length of the resonant coil 212 at the time of its installation and to make the resonance characteristics substantially equal to that of the high-frequency power source 273. In addition, a waveform adjustment circuit including a coil and a shield is inserted at one end (or the other end or both ends) of the resonant coil 212 such that a phase current and an opposite current flow symmetrically with respect to an electrical midpoint of the resonant coil 212. The waveform adjustment circuit is configured as an open circuit by electrically disconnecting the end portion of the resonant coil 212 or by setting an electrically equivalent state. The end portion of the resonant coil 212 may be ungrounded by a choke serial resistance and may be DC-connected to a fixed reference potential.

A shield plate 223 is provided to shield an electric field on the outer side of the resonant coil 212 and to form a capacitive component (C component) necessary for constituting the resonant circuit between the shield plate 223 and the resonant coil 212. The shield plate 223 is generally made of a conductive material such as an aluminum alloy, copper, a copper alloy or the like and is formed in a cylindrical shape. The shield plate 223 is disposed to be spaced apart from the outer periphery of the resonant coil 212 by, for example, about 5 to 150 mm. In general, the shield plate 223 is grounded to have an electric potential equal to that of both ends of the resonant coil 212. In order to accurately set the resonance frequency of the resonant coil 212, one end or both ends of the shield plate 223 is configured so that a tap position can be adjusted. Alternatively, in order to accurately set the resonance frequency, trimming capacitance may be inserted between the resonant coil 212 and the shield plate 223.

The high-frequency power source 273 has a power control part (control circuit) including a high-frequency oscillation circuit and a pre-amplifier for defining an oscillation frequency and the output, and an amplifier (output circuit) for amplifying an input to a predetermined output. The power control part controls the amplifier based on the output conditions relating to the frequency and power set in advance through an operation panel. The amplifier supplies a constant high-frequency power to the resonant coil 212 via a transmission line.

The plasma generation circuit configured by the resonant coil 212 is configured as a parallel resonant circuit of RLC. When the wavelength of the high-frequency power source 273 and the electrical length of the resonant coil 212 are equal to each other, the resonance condition of the resonant coil 212 is that a reactance component generated by the capacitive component or the inductive component of the resonant coil 212 is canceled out so as to become a pure resistance. However, when the plasma generation circuit generates the plasma, the actual resonance frequency varies slightly due to the fluctuation of the capacitive coupling between a voltage portion of the resonant coil 212 and the plasma or inductive coupling between the plasma generation space 201a and the plasma, or depending on the excited state of the plasma.

Thus, in the present embodiment, in order to make sure that the deviation of resonance in the resonant coil 212 at the time of the plasma generation is compensated on the power source side, the frequency matcher 274 has a function of detecting the reflective wave power supplied from the resonant coil 212 at the time of the plasma generation and complementing the output. With this configuration, in a resonance device of the present disclosure, it is possible to more accurately form a standing wave in the resonant coil 212 and to generate the plasma with extremely small capacitive coupling.

That is to say, the frequency matcher 274 detects a reflective wave power from the resonant coil 212 at the time of the plasma generation, and increases or decreases the predetermined frequency so as to minimize the reflective wave power. Specifically, the frequency matcher 274 includes a frequency control circuit configured to correct a preset oscillation frequency. The RF sensor 272 for detecting a reflective wave power in a transmission line and feeding back the voltage signal thereof to the frequency control circuit is insertedly provided on the output side of the amplifier.

The frequency control circuit includes an A/D converter configured to receive the voltage signal from a reflective wave power meter and digital-convert the voltage signal into a frequency signal, an arithmetic processing circuit configured to perform an addition/subtraction process with respect to a value of a frequency signal corresponding to the converted reflective wave and a value of a pre-stored oscillation frequency, a D/A converter configured to analog-convert the value of the frequency obtained by the addition/subtraction process into a voltage signal, and a voltage control oscillator configured to oscillate according to an voltage applied from the D/A converter. Accordingly, the frequency control circuit oscillates at a load-free resonance frequency of the resonant coil 212 before the plasma is ignited, and oscillates at a frequency obtained by increasing or reducing the predetermined frequency such that the reflective power is minimized, after the plasma is ignited. As a result, the frequency signal is applied to the amplifier such that the reflective wave is zero in the transmission line.

In the present embodiment, after the interior of the plasma generation space 201a is depressurized to a pressure within a predetermined range, a plasma gas (a nitrogen-containing gas when the nitriding is performed in the present embodiment or an oxygen-containing gas when the oxidizing treatment is performed) is supplied to the plasma generation space 201a, while maintaining the level of vacuum. Then, when a high-frequency power of 27.12 MHz is supplied from the high-frequency power source 273 to the resonant coil 212, inductive electric field is generated within the plasma generation space 201a, and as a result, the supplied gas is plasmized in the plasma generation space 201a.

In the resonance device of the present disclosure, in order to output the high frequency having an accurately resonating high frequency in accordance with the deviation of the resonance point of the resonant coil 212 at the time of the plasma generation or at the time of changing the condition of the plasma generation. It is therefore possible for the resonant coil 212 to more accurately form a standing wave. That is, as illustrated in FIG. 2, in the resonant coil 212, a standing wave whose phase voltage and opposite phase voltage are always canceled out is formed by transmission of an actual resonance frequency of the corresponding resonator including plasma. The highest phase current is generated at an electrical midpoint of the coil (a node where a voltage is zero). Accordingly, the inductive plasma excited at the electrical midpoint has almost no capacitive coupling with the wall of the process chamber and the substrate mounting table. The doughnut-shaped plasma having extremely low electrical potential can be formed within the plasma generation space 201a.

(Control Part)

Figure 3:
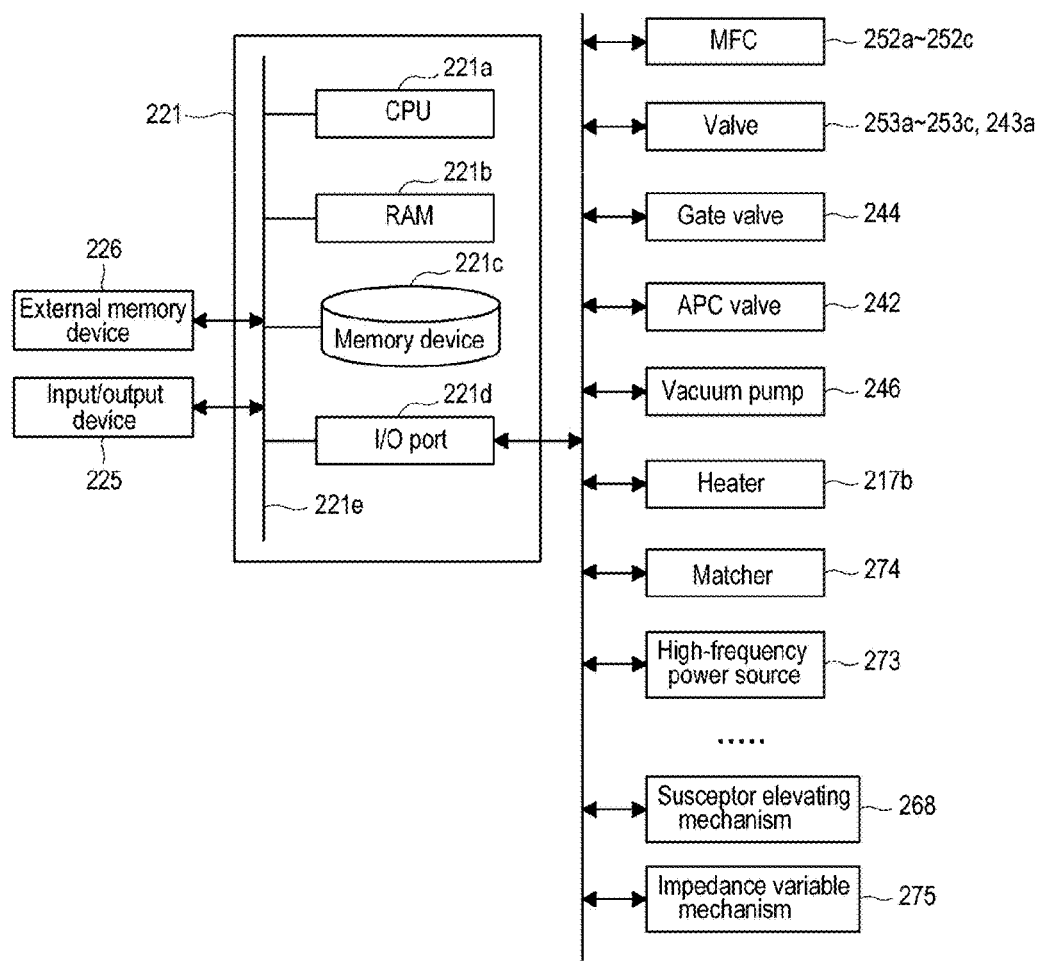
FIG. 3 is an explanatory view illustrating a control part according to an embodiment of the present disclosure.

As illustrated in FIG. 3, a controller 221 as a control part is configured as a computer including a central processing unit (CPU) 221a, a random access memory (RAM) 221b, a memory device 221c, and an I/O port 221d. The RAM 221b, the memory device 221c and the I/O port 221d are configured to exchange data with the CPU 221a via an internal bus 221e. An input/output device 225, for example, a touch panel, a mouse, a keyboard, an operation terminal or the like may be connected to the controller 221. In addition, a display part, for example, a display or the like may be connected to the controller 221.

The memory device 221c is configured by, for example, a flash memory, a hard disc drive (HDD), a CD-ROM, or the like. A control program for controlling operations of the substrate processing apparatus 100, a process recipe in which substrate processing procedures, substrate processing conditions and the like are written, are readably stored in the memory device 221c. The process recipe functions as a program for causing the controller 221 to execute each sequence in a substrate processing process to be described later, so as to obtain a predetermined result. Hereinafter, the process recipe and the control program will be generally and simply referred to as a "program". Furthermore, when the term "program" is used herein, it may indicate a case of including only the process recipe, a case of including only the control program, or a case of including both the process recipe and the control program. The RAM 221b is configured as a memory area (work area) in which a program or data read by the CPU 221a is temporarily stored.

The I/O port 221d is connected to the MFCs 252a to 252c, the valves 253a to 253c, 243a, and 243b, the gate valve 244, the APC 242, the vacuum pump 246, the heater 217b, the RF sensor 272, the high-frequency power source 273, the frequency matcher 274, the susceptor elevating mechanism 268, the impedance variable mechanism 275, and the like.

The CPU 221a is configured to read the control program from the memory device 221c and execute the same. The CPU 221a also reads the process recipe from the memory device 221c according to an input of an operation command from the input/output device 225. In addition, as illustrated in FIG. 1, the CPU 221a is configured to control, according to the contents of the process recipe thus read, the adjusting operation of opening degree of the APC 242, the opening/closing operation of the valve 243b, and the driving and stopping of the vacuum pump 246 through the I/O port 221d and a signal line A. The CPU is also configured to control the operation of moving the susceptor up and down with the susceptor elevating mechanism 268 through a signal line B. The CPU is also configured to control, through a signal line C, the operation of adjusting a supply amount of power with respect to the heater 217b based on the temperature sensor (temperature adjusting operation) or the impedance value adjusting operation by the impedance variable mechanism 275. The CPU is also configured to control the opening/closing operation of the gate valve 244 through a signal line D. The CPU is also configured to control the operation of the RF sensor 272, the frequency matcher 274 and the high-frequency power source 273 through a signal line E. The CPU is also configured to control, through a signal line F, the flow rate adjusting operation of various kinds of gases by the MFCs 252a to 252c and the opening/closing operation of the valves 253a to 253c and 243a.

The controller 221 may be configured by installing, on the computer, the aforementioned program stored in an external memory device 226 (for example, a magnetic tape, a magnetic disc such as a flexible disc or a hard disc, an optical disc such as a CD or DVD, a magneto-optical disc such as an MO, a semiconductor memory such as a USB memory or a memory card). The memory device 221c or the external memory device 226 is configured as a non-transitory computer-readable recording medium. Hereinafter, the memory device 221c and the external memory device 226 will be generally and simply referred to as a "recording medium." When the term "recording medium" is used herein, it may indicate a case of including only the memory device 221c, a case of including only the external memory device 226, or a case of including both the memory device 221c and the external memory device 226. Furthermore, the program may be supplied to the computer using a communication means such as the Internet or a dedicated line, instead of using the external memory device 226.

(2) Substrate Processing Process

Figure 4:
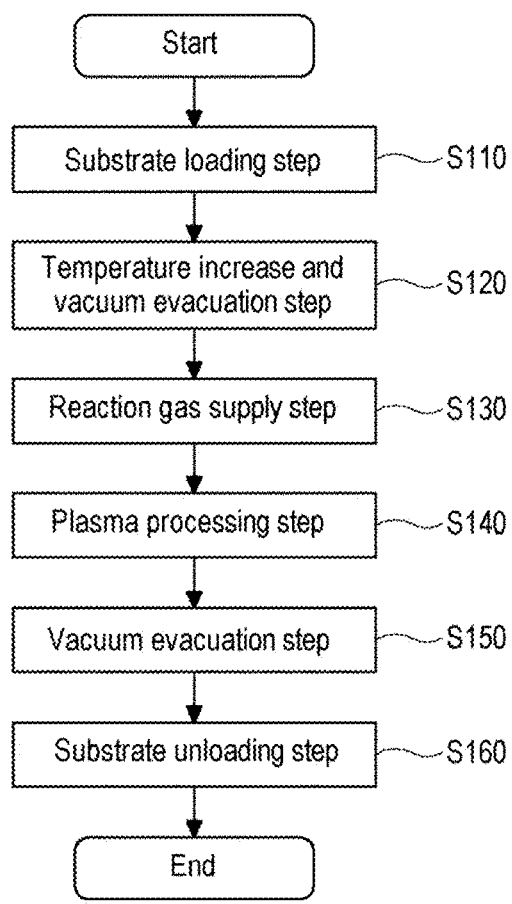
FIG. 4 is a flowchart illustrating a substrate processing process according to a first embodiment of the present disclosure.

Next, a substrate processing process according to the present embodiment will mainly be described with reference to FIG. 4. The substrate processing process according to the present embodiment, which is one of the processes of manufacturing a semiconductor device such as a flash memory or the like, is carried out by the aforementioned substrate processing apparatus 100. In the following descriptions, the operations of the respective parts constituting the substrate processing apparatus 100 are controlled by the controller 221.

Figure 5:
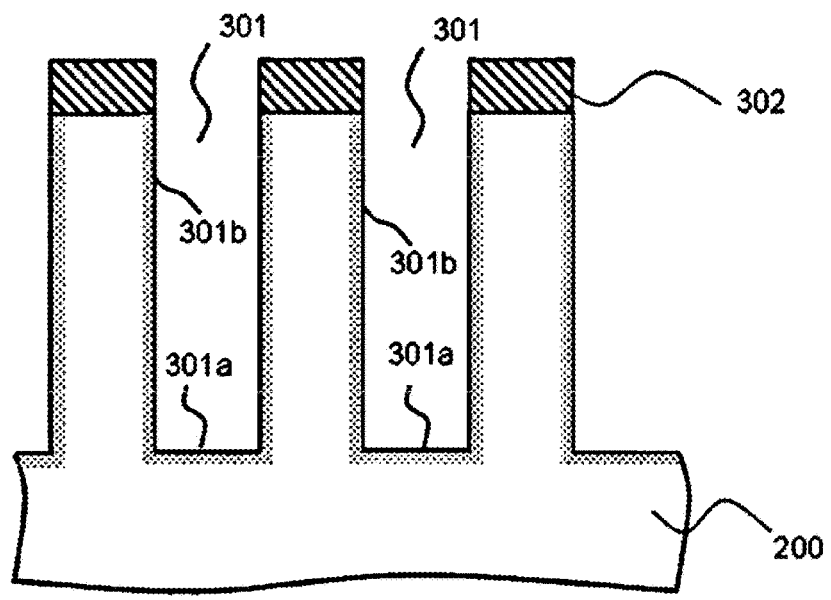
FIG. 5 is an explanatory view of a substrate on which a groove (trench) processed in the substrate processing process according to the first embodiment of the present disclosure is formed.

The wafer 200 processed in the substrate processing process according to the present embodiment has a silicon layer on its surface, and for example, as illustrated in FIG. 5, a trench 301 having uneven portions (grooves) with a high aspect ratio is formed in advance. Here, the high aspect ratio (ratio of a depth to a width of the trench) in the present embodiment refers to 10 or more, or at least 2 or more. The trench 301 is formed by, for example, forming a mask layer 302 having a predetermined pattern on the wafer 200 and etching a surface of the wafer 200 to a predetermined depth.

In the present embodiment, the nitriding (nitride film formation or nitrogen dosing) is performed on a silicon layer of an inner wall of the trench 301. At this time, the processing apparatus is controlled such that a difference in thickness of the nitride film at an upper portion and a lower portion (a sidewall portion in the lower side) of a side portion 301b of the trench is small or such that a step coverage, which is a ratio of a thickness of the nitride film of a bottom portion 301a of the trench 301 to a thickness of the nitride film of the side portion 301b of the trench 301, is desirable (i.e., such that the aforementioned ratio is small). Hereinafter, the nitriding will be described in detail with reference to a flowchart of FIG. 4.

(Substrate Loading Step S110)

First, the wafer 200 is loaded into the process chamber 201. Specifically, the susceptor elevating mechanism 268 moves the susceptor 217 down to a transfer position of the wafer 200 and the wafer push-up pins 266 penetrate the through hole 217a of the susceptor 217. As a result, the wafer push-up pins 266 protrude from the surface of the susceptor 217 by a predetermined height.

Subsequently, the gate valve 244 is opened and the wafer 200 is loaded into the process chamber 201 from a vacuum transfer chamber (not shown) adjacent to the process chamber 201 by using a transfer mechanism (not shown). The loaded wafer 200 is supported horizontally on the wafer push-up pins 266 protruding from the surface of the susceptor 217. After the wafer 200 is loaded into the process chamber 201, the transfer mechanism is withdrawn to the outside of the process chamber 201 and the gate valve 244 is closed to tightly seal the interior of the process chamber 201. Thereafter, the susceptor elevating mechanism 268 moves the susceptor 217 to a predetermined position between the lower end 203a of the resonant coil 212 and an upper end 245a of the loading/unloading port 245. As a result, the wafer 200 is supported on an upper surface of the susceptor 217. The position of the wafer 200 is adjusted such that a distance between the wafer 200 mounted on the susceptor 217 and the lower end of the resonant coil 212 reaches a predetermined distance which falls within a range of, for example, 40 to 200 mm. It is therefore possible to adjust a film thickness of the nitride film or a generation amount of particles. In addition, the substrate loading step S110 may be performed while purging the interior of the process chamber 201 with an inert gas or the like.

(Temperature Increase and Vacuum Evacuation Step S120)

Subsequently, the temperature of the wafer 200 loaded into the process chamber 201 is increased. Since the heater 217b is heated in advance, by keeping the loaded wafer 200 held on the susceptor 217 in which the heater 217b is embedded, the wafer 200 is heated to a predetermined value of, for example, 100 degrees C. or higher, specifically 650 to 900 degrees C. The deposition rate is not likely to be maintained at a temperature of less than 100 degrees. Further, in order to form a nitrogen film having good quality, it is desirable that the nitriding is performed at a high temperature of 650 to 900 degrees C. In the present embodiment, the wafer 200 is heated such that the temperature of the wafer 200 becomes 700 degrees C. While increasing the temperature of the wafer 200, the interior of the process chamber 201 is evacuated by the vacuum pump 246 via the gas exhaust pipe 231 so that the internal pressure of the process chamber 201 becomes a predetermined value which falls within a range of 1 to 500 Pa, e.g., 200 Pa. The vacuum pump 246 is operated at least until a substrate unloading step S160, which will be described later, is completed.

(Reaction Gas Supply Step S130)

Subsequently, the supply of an $N_2$ gas as a reaction gas is started. Specifically, the valve 253a is opened, and the supply of the $N_2$ gas into the process chamber 201 via the buffer chamber 237 is started while controlling the flow rate by the MFC 252a. At this time, the flow rate of the $N_2$ gas is set to a predetermined value which falls within a range of, for example, 100 to 1,000 sccm, more preferably 200 sccm. Further, the interior of the process chamber 201 is exhausted by adjusting the opening degree of the APC 242 such that the internal pressure of the process chamber 201 becomes a predetermined pressure which falls within a range of, for example, 1 to 100 Pa, preferably 3 to 10 Pa. In the present embodiment, the opening degree of the APC 242 is adjusted such that the internal pressure of the process chamber 201 particularly becomes 5 Pa. While appropriately evacuating the interior of the process chamber 201 in this manner, the supply of the $N_2$ gas is continued until the end of the plasma processing step S140 to be described later.

(Plasma Processing Step S140)

When the internal pressure of the process chamber 201 is stabilized, a high-frequency power starts to be applied from the high-frequency power source 273 to the resonant coil 212. In the present embodiment, a high-frequency power of 27.12 MHz is supplied at a power of, for example, 5.0 kW or less, preferably 3.5 kW or less, more preferably 2.0 kW or less. In the present embodiment, in particular, the high-frequency power is supplied at a power of 1.0 kW.

Thus, a high-frequency electric field is formed within the plasma generation space 201a. At this electric field, the doughnut-shaped inductive plasma is excited at a position as high as an electrical midpoint of the resonant coil 212 of the plasma generation space 201a. An $N_2$ gas in a plasma state is dissociated and generates a nitrogen active species such as a radical (nitrogen radical) containing a nitrogen element (N) or ion (nitrogen ion), or a reactive species.

As described above, the standing wave in a state where the phase voltage and the opposite phase voltage are always canceled out is formed and the highest phase current is generated at the electrical midpoint (a node where a voltage is zero) of the coil. Thus, the inductive plasma excited at the electrical midpoint has almost no capacitive coupling with the wall of the process chamber or the substrate mounting table. The doughnut-shaped plasma having extremely low electrical potential may be formed within the plasma generation space 201a.

Further, as described above, since the power control part installed in the high-frequency power source 273 compensates for deviation of the resonance point in the resonant coil 212 due to a fluctuation of capacitive coupling or inductive coupling of plasma, thereby more accurately forming a standing wave. Accordingly, there is almost no capacitive coupling and the plasma having extremely low electrical potential can be more reliably formed within the plasma generation space.

Since the plasma having extremely low electrical potential is generated, it is possible to suppress generation of a sheath on the wall of the plasma generation space 201a or on the substrate mounting table. Thus, the ions of the plasma are not accelerated.

In the wafer 200 held on the susceptor 217 in the substrate process space 201b, the nitrogen active species or reactive species (for example, nitrogen radical or unaccelerated ions) generated in the plasma generation space 201a is uniformly supplied into the trench 301. The supplied radical or ions uniformly react with the bottom portion 301a and the side portion 301b to modify a silicon layer to a silicon nitride film having good step coverage. In addition, since the occurrence of ion attack caused by accelerated ions can be prevented, it is possible to suppress wafer damage due to the ions.

Further, since the ion acceleration is prevented, there is no sputtering action on the peripheral wall of the plasma generation space 201a, which also does not damage the peripheral wall of the plasma generation space 201a. As a result, it is possible to prolong the lifespan of the apparatus. It is also possible to prevent a problem that the member component of the plasma generation space 201a or the like enters the plasma and contaminates the wafer.

In addition, since the power control part installed in the high-frequency power source 273 compensates for a reflective wave power due to impedance mismatch occurring in the resonant coil 212 at the high-frequency power source 273 side and complements a lowered effective load power, an initial high-frequency power can be always reliably supplied to the resonant coil 212, thereby stabilizing the plasma. Thus, it is possible to uniformly process the wafer held in the substrate process space at a predetermined rate.

Thereafter, after the lapse of a predetermined processing time, e.g., 10 to 300 seconds, the output of electric power from the high-frequency power source 273 is stopped and discharging of the plasma within the process chamber 201 is stopped. The valve 253a is closed to stop the supply of the $N_2$ gas into the process chamber 201. In this manner, the plasma processing step S140 is completed.

By doing so, it is possible to allow the thickness of the nitride film formed in the bottom portion 301a of the trench 301 to approach the thickness of the nitride film formed in the side portion 301b. Accordingly, it is possible to form a film having good step coverage.

(Vacuum Evacuation Step S150)

When the supply of the $N_2$ gas is stopped after the lapse of a predetermined processing time, the interior of the process chamber 201 is evacuated using the gas exhaust pipe 231. Thus, the $N_2$ gas within the process chamber 201 or the exhaust gas reacted with the $N_2$ gas is exhausted to out of the process chamber 201. Thereafter, the internal pressure of the process chamber 201 is adjusted to the same pressure as that of a vacuum transfer chamber (unloading place of the wafer 200) (not shown) adjacent to the process chamber 201 by adjusting the opening degree of the APC 242.

(Substrate Unloading Step S160)

When the interior of the process chamber 201 becomes a predetermined pressure, the susceptor 217 is moved down to a transfer position of the wafer 200 to support the wafer 200 on the wafer push-up pin 266. Then, the gate valve 244 is opened and the wafer 200 is unloaded from the process chamber 201 using a transfer mechanism (not shown). At this time, the wafer 200 may be unloaded while purging the interior of the process chamber 201 with an inert gas or the like. In this manner, the substrate processing process according to the present embodiment is completed.

Figure 6:
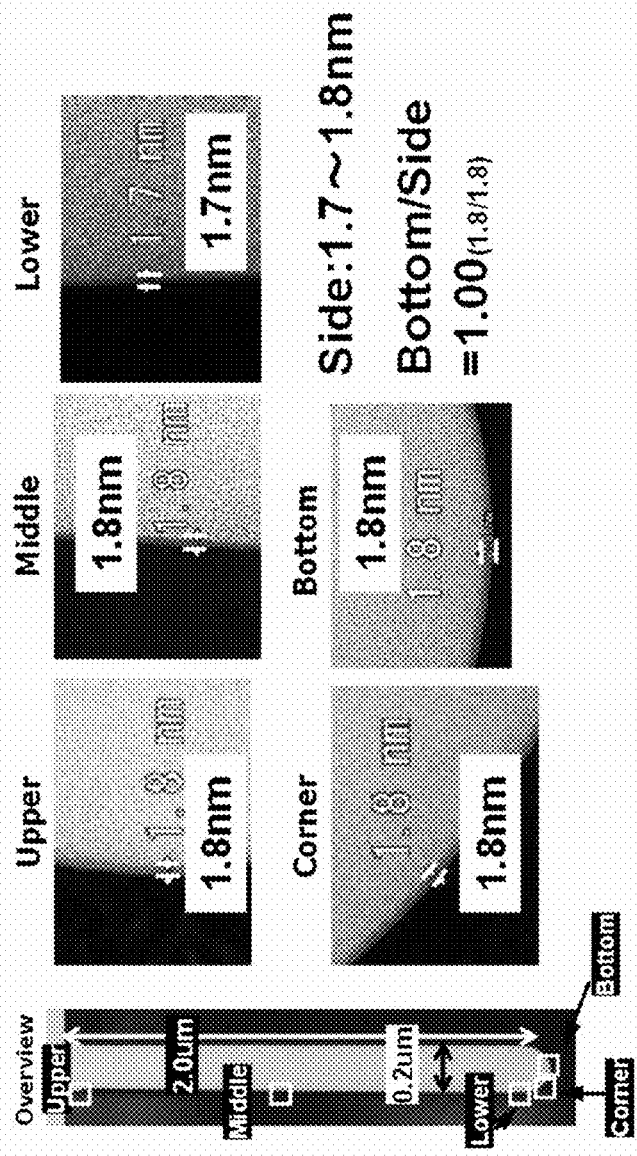
FIG. 6 is an explanatory view illustrating a groove (trench) processed in the substrate processing process according to the first embodiment of the present disclosure.

FIG. 6 is a view illustrating an example in which a nitride film is formed on a trench having a silicon layer during the substrate processing process according to an embodiment of the present disclosure. The left drawing (overview) is an enlarged view of the trench having a depth d of 2.0 μm and a width W of 0.2 μm. The right drawing is an enlarged view of upper, middle, lower, corner, and bottom portions of the trench when the nitriding was performed in the embodiment of the present disclosure. The numerical values of the right drawing indicate film thicknesses of films formed by the nitriding.

As shown in the right drawing, it can be seen that the nitride film formed according to the present disclosure has the film thicknesses of 1.8 nm in the upper portion, 1.8 nm in the middle portion, 1.7 nm in the lower portion, 1.8 nm in the corner portion, and 1.8 nm in the bottom portion. This shows substantially the uniform step coverage characteristics. Thus, it is possible to reduce a fluctuation of performance by making the uniform characteristics of a semiconductor device.

Figure 7:
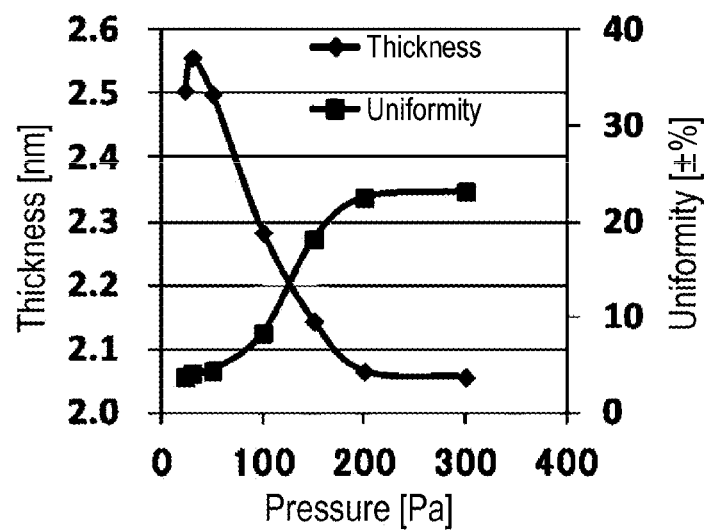
FIG. 7 is an explanatory view illustrating a relationship of pressure dependency of a nitride film thickness and uniformity of a film.

FIG. 7 shows the results of measuring values of film thicknesses and in-plane uniformity on a silicon substrate when the nitriding was performed according to the present embodiment. The values are measured by an ellipsometer. As the measurement result indicates, it can be seen that, in the nitriding according to the present embodiment, a nitride film of 2.0 nm or more can be formed with the good uniformity on the silicon substrate in a pressure region where the internal pressure of the process chamber under a reaction gas ($N_2$ gas) atmosphere is within a range of 1 to 100 Pa. Further, in a pressure region where the internal pressure of the process chamber is less than 1 Pa, a deposition rate rapidly drops, and it is not possible to obtain a practical nitride film thickness (for example, 2.0 nm). In addition, in a pressure region where the internal pressure of the process chamber is more than 100 Pa, the pressure remarkably increases and the in-plane uniformity of the nitride film remarkably deteriorates, and it is not possible to maintain good in-plane uniformity (uniformity of 10% or less), compared with the related art. Furthermore, in the present embodiment, it was confirmed that a high deposition rate and good film thickness uniformity are obtained, in particular, with the internal pressure of the process chamber within a range of 3 to 10 Pa. Since, in the pressure region of 3 to 10 Pa, the good in-plane uniformity is obtained and the deposition rate is also maximized, the pressure region of 3 to 10 Pa is particularly appropriate for the nitriding.

Showing this high deposition rate and good film thickness uniformity when a modifying process such as the nitriding is performed under a condition of low pressure where the internal pressure of the process chamber is 1 to 100 Pa is not a general tendency of the modifying process but unique to a case where the plasma process is performed using the resonant coil 212 configured as in the embodiment of the present disclosure. The present inventor found out such a remarkable tendency as in the embodiment of the present disclosure by experiments. Thus, in the embodiment of the present disclosure, the nitriding is performed by setting the internal pressure of the process chamber (process pressure) to fall within a range where the deposition rate and the film thickness uniformity are enhanced according to the dropped pressure, preferably within a range of 1 to 100 Pa, more preferably within a range of 3 to 10 Pa.

In the aforementioned embodiment, there has been described the example in which the nitriding is performed using the nitrogen ($N_2$) gas, but an ammonia ($NH_3$) gas, or a mixture of the $N_2$ gas and the $NH_3$ gas may also be used as the nitrogen-containing gas. Also, a mixture gas obtained by adding a hydrogen ($H_2$) gas or a rare gas (Ar, He, Ne, or the like) as an inert gas to the nitrogen-containing gas may be used. In the case of using the mixture gas that adds the $H_2$ gas, for example, by setting the overall flow rate of the supplied gas or the internal pressure of the process chamber 201 to be the same as that of the case of using the $N_2$ gas alone, the mixture gas is supplied such that the flow rate of the $N_2$ gas and the $H_2$ gas is at a 1:1 ratio.

In the aforementioned embodiment, there has been described the example in which the nitriding is performed on the silicon layer on the inner wall of the trench 301 has been described. However, various films formed on the wafer 200 such as a gate insulating film, a metal film, and the like may also be used as a process target. The nitrided silicon layer may be various silicon such as single crystal silicon, polysilicon, amorphous silicon, or the like. The nitriding may also be performed on a silicon-containing film, a metal-containing film, and a high-k film, other than the silicon layer.

(3) Effects According to the Present Embodiment

According to the present embodiment, one or more effects as set forth below may be achieved.

(a) By generating the plasma of a process gas under a low pressure condition using the resonant coil configured as in the present embodiment and processing the surface of the substrate with the plasma, it is possible to form a nitride film having the good step coverage even on the substrate surface having a high aspect ratio.

(b) In particular, by setting the process pressure in generating the plasma and processing the substrate to fall within a range of 1 to 100 Pa, more specifically 3 to 10 Pa, using the ICP type substrate processing apparatus configured as in the present embodiment, it is possible to obtain a high deposition rate and good step coverage. This effect is not obtained by simply lowering the internal pressure of the process chamber, but it is remarkable when the ICP type substrate processing apparatus configured as in the present embodiment is used.

(c) The nitrogen radical and unaccelerated ions are gently and uniformly supplied into the trench 301 in the wafer 200 held on the susceptor 217 in the substrate process space 201b. The supplied radical and ions uniformly react with the bottom portion 301a and the side portion 301b to modify a silicon layer to a silicon nitride film having good step coverage. In addition, since the ion attack due to acceleration can be prevented, it is possible to suppress the wafer damage due to the ions.

(d) Since the ion acceleration is prevented, there is no sputtering action on the peripheral wall of the plasma generation space, which also does not damage the peripheral wall of the plasma generation space. As a result, it is possible to prolong the lifespan of the apparatus, and further to prevent a problem that a member component of the plasma generation space or the like is introduced into the plasma and contaminates the wafer.

(e) Since the power control part such as the frequency matcher installed in the high-frequency power source 273 or the like compensates for a reflective wave power due to impedance mismatch occurring in the resonant coil 212 at the high-frequency power source 273 side and complements a lowered effective load power, a high-frequency power of initial level can be always reliably supplied to the resonant coil 212, thereby stabilizing the plasma. Thus, it is possible to uniformly process the wafer held in the substrate process space at a predetermined rate.

(f) Since the substrate is processed while heating the substrate to 650 degrees C. or higher, it is possible to form a film having higher quality.

(g) According to the present embodiment, since the positions of the resonant coil and the substrate can be adjusted by controlling the susceptor elevating mechanism such that the side portion and the bottom portion of the groove are oxidized, it is possible to control the film thicknesses of the side portion and the bottom portion to be equal to obtain good step coverage.

(h) According to the present embodiment, an electric field formed within the process chamber 201 is a high-frequency electric field having a frequency corresponding to an aspect ratio of the trench 301. Thus, in addition to obtaining the plasma with high density and increasing an arrival rate in which the reactive species reaches to the bottom portion 301a of the trench 301, the process efficiency within the trench 301 can be enhanced. Further, the finer and high-speed processing can be performed.

In the aforementioned embodiment, the nitriding using the $N_2$ gas has been described, but an oxidizing treatment using an $O_2$ gas as an oxygen-containing gas may be performed using the aforementioned substrate processing apparatus 100. Hereinafter, the oxidizing treatment using the $O_2$ gas will be described as a second embodiment.

Second Embodiment

In the present embodiment, an oxidizing treatment is performed on an inner wall of the trench 301. At this time, the processing apparatus is controlled such that the step coverage, which is a ratio of a thickness of the oxide film of the bottom portion 301a of the trench 301 to a thickness of the oxide film of the side portion 301b of the trench 301, is desirable. Further, similar to the case of the nitriding, a specific process of oxidizing treatment is as illustrated in FIG. 4, and hereinafter, particularly difference with the nitriding will be mainly described in detail.

(Reaction Gas Supply Step S130)

After the temperature increase and vacuum evacuation step S120, during a reaction gas supply step S130, the supply of an $O_2$ gas as a reaction gas is started. Specifically, the valve 253a is opened, and the supply of the $O_2$ gas into the process chamber 201 via the buffer chamber 237 is started, while controlling the flow rate by the MFC 252a. At this time, the flow rate of the $O_2$ gas may be set to a predetermined value which falls within a range of, for example, 100 to 1,000 sccm. Further, the interior of the process chamber 201 is exhausted by adjusting the opening degree of the APC 242 such that the internal pressure of the process chamber 201 is within a range of, for example, 1 to 1,000 Pa, preferably 150 Pa. While appropriately evacuating the interior of the process chamber 201 in this manner, the supply of the $O_2$ gas is continued until the end of a plasma processing step S140.

(Plasma Processing Step S140)

When the internal pressure of the process chamber 201 is stabilized, a high-frequency power starts to be applied from the high-frequency power source 273 to the resonant coil 212.

Thus, a high-frequency electric field is formed within the plasma generation space 201a. At this electric field, the doughnut-shaped inductive plasma is excited at a position as high as an electrical midpoint of the resonant coil 212 of the plasma generation space 201a. An $O_2$ gas in a plasma state is dissociated and generates an oxygen active species such as a radical (oxygen radical) containing oxygen (O) or ion (oxygen ion), or a reactive species.

In the wafer 200 held on the susceptor 217 in the substrate process space 201b, the oxygen active species or reactive species (e.g., oxygen radical or unaccelerated ions) generated in the plasma generation space 201a is uniformly supplied into the trench 301. The supplied radical or ions uniformly react with the sidewall 301a or 301b to modify a silicon layer to a silicon oxide film having good step coverage.

Thereafter, after the lapse of a predetermined processing time, e.g., 10 to 300 seconds, the output of electric power from the high-frequency power source 273 is stopped and discharging of the plasma within the process chamber 201 is stopped. The valve 253a is closed to stop the supply of the $O_2$ gas into the process chamber 201. In this manner, the plasma processing step S140 is completed.

By doing so, it is possible to allow the thickness of the oxide film formed in the bottom portion 301*a* of the trench 301 to approach the thickness of the oxide film formed in the side portion 301*b*. Accordingly, it is possible to form a film having good step coverage.

In the present embodiment, there has been described the example in which the oxidizing treatment is performed using the oxygen ($O_2$) gas, but the oxidizing treatment may also be performed by the plasma-exciting a mixture of the $O_2$ gas and a hydrogen ($H_2$) gas. When the mixture of the $O_2$ gas and the $H_2$ gas are activated by the plasma, H, OH, and the like are generated. This OH oxidizes the surface of the silicon-containing layer to form an oxide film. Further, the H has more strong reduction properties with respect to the surface of the metal-containing layer, compared with reduction properties with respect to the surface of the silicon-containing layer. Thus, when the wafer 200 whose silicon-containing layer and metal-containing layer are exposed to its surface is processed using the plasma of the mixture gas, the surface of the silicon-containing layer can be selectively oxidized. In the case of using the mixture gas that adds the $H_2$ gas, for example, by setting the overall flow rate of the supplied gas or the internal pressure of the process chamber 201 to become the same as that of the case of using the $O_2$ gas alone, the mixture gas is supplied such that the flow rate of the $O_2$ gas and the $H_2$ gas is at a 50 sccm:950 sccm (5:95) ratio.

As the oxygen-containing gas, it may be possible to use, in addition to the $O_2$ gas, a nitrogen monoxide (NO) gas, a nitrous oxide ($N_2O$) gas, a nitrogen dioxide ($NO_2$) gas, or the like.

Also, a mixture gas that a rare gas (Ar, He, Ne, or the like) as an inert gas is added to the oxygen-containing gas may be used. This rare gas contributes to stabilization of the plasma discharging when the plasma excitation is performed.

In the present embodiment, it is possible to form an oxide film having the good uniformity on the silicon substrate in a pressure region of the reaction gas ($O_2$ gas) having a range of 1 to 1,000 Pa, preferably 150 Pa.

Further, in the present embodiment, the pattern in which the trench 301 including the uneven portions having a high aspect ratio as illustrated in FIG. 5 is funned has been described. As a film having such a pattern, the oxidizing treatment according to the present embodiment may be performed on a floating gate layer 603 already formed as illustrated in FIG. 8 during a process of manufacturing a three-dimensionally laminated flash memory.

Figure 8:
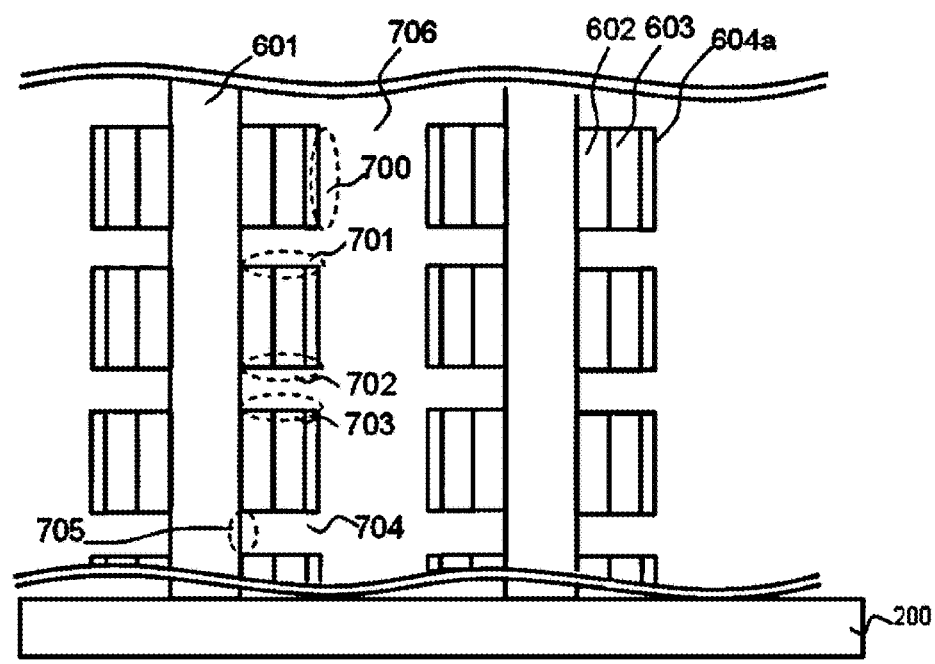
FIG. 8 is an explanatory view of a substrate on which a groove (trench) processed in the substrate processing process according to the first embodiment of the present disclosure is formed.

FIG. 8 will be described in detail. A plurality of columnar-shaped insulators 601 is formed on a surface of the wafer 200. In FIG. 8, two columnar-shaped insulators 601 are illustrated but a plurality of columnar-shaped insulators is adjacent to each other at a fine interval. They are omitted in illustration.

A channel layer is formed on the columnar-shaped insulator 601. In accordance with the channel layer, a gate insulating film 602 and a floating gate layer 603 are sequentially laminated in a direction perpendicular to a direction in which the columnar-shaped insulator 601 is extended. This laminate structure will be referred to as a laminate structure of the flash memory. Here, the direction perpendicular the direction in which the columnar-shaped insulator 601 is extended is also a direction parallel to the surface of the wafer 200.

Another pattern is formed in a direction in which the laminate structure of the flash memory is extended. For example, the laminate structure of the flash memory having the gate insulating film 602 and the floating gate layer 603 formed on the adjacent columnar-shaped insulator 601 is formed. A narrow space is formed between a front end of the laminate structure of the flash memory and another pattern (here, the opposite floating gate layer 603). Meanwhile, a plurality of laminate structures of the flash memory laminated in a direction perpendicular to the extending direction of the columnar-shaped insulator 601 is formed in parallel on a side surface in the extending direction of the columnar-shaped insulator 601. Miniaturization is also performed between the laminate structures of the flash memory.

In this miniaturized 3D pattern, for example, because of the device performance, it is required to uniformly form a film on a front end 700 of the laminate structure, a side surface 701 present in a gas supply direction among side surfaces of the laminate structure, a side surface 702 present in the opposite side of the gas supply direction among the side surfaces of the laminate structure, and an adjacent side surface 703 of the laminate structure. In addition, similarly, it is also required to uniformly form a film on a bottom surface 705, which is a lower portion of a groove 704 between the laminate structures.

It may be considered that the miniaturized 3D pattern is processed in a conventional CVD device. However, since the CVD device performs a vapor phase growth, a so-called void or seam may be generated on the pattern. Thus, it was difficult to uniformly process a film.

Meanwhile, in the oxidizing treatment according to the present embodiment, since the oxygen active species or reactive species (e.g., oxygen radical or unaccelerated ions) are gently and uniformly supplied into a trench 706, the supplied radical and ions are uniformly supplied to the front end 700, the side surface 701, the side surface 702, the side surface 703, and the bottom surface 705 of the laminate structure. Thus, the silicon layer of the front end 700, the side surface 701, the side surface 702, the side surface 703, and the bottom surface 705 of the laminate structure can be uniformly oxidized and modified to a silicon oxide film having good step coverage. In other words, the silicon oxide film having good step coverage can be formed. In addition, since the ion attack due to acceleration can be prevented, it is possible to suppress the wafer damage due to the ions.

In particular, in the laminate structure of the flash memory shown in FIG. 8, a front end of the floating gate layer 603 formed of polysilicon may be uniformly oxidized and an oxide silicon layer 604*a* of an ONO layer which is charge accumulation layer may be uniformly formed.

There has been described above the example in which the oxidizing treatment according to the present embodiment is applied to the already formed silicon film during one of the manufacturing processes of the three-dimensionally laminated flash memory. However, regarding the similar miniaturized 3D pattern, the silicon layer of a 3D pattern surface may also be nitrided by applying the nitriding of the first embodiment.

According to the present disclosure in some embodiments, it is possible to provide a technique capable of forming a nitride film having good step coverage even on a surface of a structure having a high aspect ratio.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
   preparing a substrate processing apparatus including:
   a substrate process chamber having a plasma generation space where a supplied nitrogen-containing gas is plasma-excited and a substrate process space where a substrate is mounted at the time of processing the substrate in communication with the plasma generation space;
   an inductive coupling structure including a coil installed to be wound around an outer periphery of the plasma generation space and an impedance matching circuit connected to the coil, wherein an electric field combining the coil and the impedance matching circuit has a length of an integer multiple of a wavelength of an applied high-frequency power;
   a substrate mounting table configured to mount the substrate at a position under a lower end of the coil; and
   an elevating mechanism configured to move the substrate mounting table up and down to adjust a distance between the substrate mounted on the substrate mounting table and the lower end of the coil;
   mounting the substrate, on which a structure having an aspect ratio of 10 or greater is formed, on the substrate mounting table;
   adjusting, by the elevating mechanism, the distance between the substrate and the lower end of the coil to become a predetermined distance that falls within a range of 40 to 200 mm;
   supplying the nitrogen-containing gas into the substrate process chamber;
   starting a plasma excitation of the nitrogen-containing gas in the plasma generation space by applying the high-frequency power to the coil; and
   nitriding a surface of the substrate with an active species containing a nitrogen element generated by the plasma excitation, the nitrogen element being derived from the nitrogen-containing gas in the plasma generation space, the active species being supplied into the structure on the substrate to react with at least a bottom surface and a side surface of the structure,
   wherein in the act of nitriding the surface of the substrate, an internal pressure of the substrate process chamber is set to fall within a range of 1 to 100 Pa such that at least the bottom surface and the side surface of the structure are uniformly nitrided, and
   wherein in the act of adjusting the distance between the substrate and the lower end of the coil, the predetermined distance is adjusted to adjust a film thickness of a nitride film that is formed in the act of nitriding the surface of the substrate.

2. The method of claim 1, wherein the surface of the substrate includes at least one selected from the group consisting of a silicon-containing film, a metal-containing film, and a high-k film.

3. The method of claim 1, in the act of nitriding the surface of the substrate, wherein the internal pressure of the substrate process chamber is set to fall within a range of 3 to 10 Pa.

4. The method of claim 1, wherein the substrate mounting table includes a heater configured to heat the mounted substrate, and in the act of nitriding the surface of the substrate, the substrate is heated to a temperature which falls within a range of 650 to 900 degrees C. by the heater.

5. The method of claim 1, in the act of supplying the nitrogen-containing gas into the substrate process chamber, wherein a nitrogen gas alone is supplied into the substrate process chamber.

6. The method of claim 1, wherein the nitrogen-containing gas is a mixture of a nitrogen gas and a hydrogen gas.

7. The method of claim 6, wherein a ratio of flow rate of the nitrogen gas and the hydrogen gas is 1:1.

8. The method of claim 1, wherein the nitrogen-containing gas is a nitrogen gas, an ammonia gas, or a mixture of the nitrogen gas and the ammonia gas.

9. A non-transitory computer-readable recording medium storing a program that causes a computer to perform a process, in a substrate processing apparatus including:
   a substrate process chamber having a plasma generation space where a supplied nitrogen-containing gas is plasma-excited and a substrate process space where a substrate is mounted at the time of processing the substrate in communication with the plasma generation space;
   an inductive coupling structure including a coil installed to be wound around an outer periphery of the plasma generation space and an impedance matching circuit connected to the coil, wherein an electric field combining the coil and the impedance matching circuit has a length of an integer multiple of a wavelength of an applied high-frequency power;
   a substrate mounting table configured to mount the substrate at a position under a lower end of the coil; and
   an elevating mechanism configured to move the substrate mounting table up and down to adjust a distance between the substrate mounted on the substrate mounting table and the lower end of the coil, the process comprising;
   mounting the substrate, on which a structure having an aspect ratio of 10 or greater is formed, on the substrate mounting table;
   adjusting, by the elevating mechanism, the distance between the substrate and the lower end of the coil to become a predetermined distance that falls within a range of 40 to 200 mm;
   supplying the nitrogen-containing gas into the substrate process chamber;
   starting a plasma excitation of the nitrogen-containing gas in the plasma generation space by applying the high-frequency power to the coil; and
   nitriding a surface of the substrate with an active species containing a nitrogen element generated by the plasma excitation, the nitrogen element being derived from the nitrogen-containing gas in the plasma generation space, the active species being supplied into the structure on the substrate to react with at least a bottom surface and a side surface of the structure,
   wherein in the act of nitriding the surface of the substrate, an internal pressure of the substrate process chamber is set to fall within a range of 1 to 100 Pa such that at least the bottom surface and the side surface of the structure are uniformly nitrided, and
   wherein in the act of adjusting the distance between the substrate and the lower end of the coil, the predetermined distance is adjusted to adjust a film thickness of a nitride film that is formed in the act of nitriding the surface of the substrate.

* * * * *